United States Patent [19]

Holman, II

[11] 4,117,412

[45] Sep. 26, 1978

[54] PHONOGRAPH PREAMPLIFIER NETWORK WITH INFRASONIC CUTOFF RESPONSE

[75] Inventor: Tomlinson M. Holman, II, Cambridge, Mass.

[73] Assignee: Advent Corporation, Cambridge, Mass.

[21] Appl. No.: 810,676

[22] Filed: Jun. 27, 1977

Related U.S. Application Data

[63] Continuation-in-part of Ser. No. 736,404, Oct. 28, 1976, Pat. No. 4,032,855.

[51] Int. Cl.$^2$ ............................................. H03F 1/34
[52] U.S. Cl. .................................. 330/107; 330/109; 330/294; 330/304
[58] Field of Search ............... 330/107, 109, 294, 302, 330/304; 333/28 T; 328/167; 179/1 D, 100.1 TC

[56] References Cited

PUBLICATIONS

Lynch, "Operational Amplifier Basics", Radio-Electronics, May, 1968, pp. 54–57.

Primary Examiner—James B. Mullins
Attorney, Agent, or Firm—Kenway & Jenney

[57] ABSTRACT

A phonograph preamplifier network with infrasonic cutoff response. In one form, the preamplifier network is a single stage active filter configuration with a high gain, high input impedance differential amplifier provided with an RIAA equalization feedback filter network coupled between the amplifier output and inverting input. An RC filter network is coupled between the inverting amplifier input and ground potential to provide a single, low frequency real axis pole. In addition, an input filter feedback network is coupled between the preamplifier input terminal and the non-inverting input of the amplifier, and further boot-strapped to the amplifier inverting input. The network provides a pair of low frequency off-axis complex poles. The RC filter and the input filter feedback networks are adapted to control the infrasonic frequency response of the active filter preamplifier network so that the amplifier network is characterized by an 18 dB per octave roll-off response at frequencies below a predetermined infrasonic frequency, and a relatively flat response at frequencies in a range adjoining and above that infrasonic frequency.

10 Claims, 4 Drawing Figures

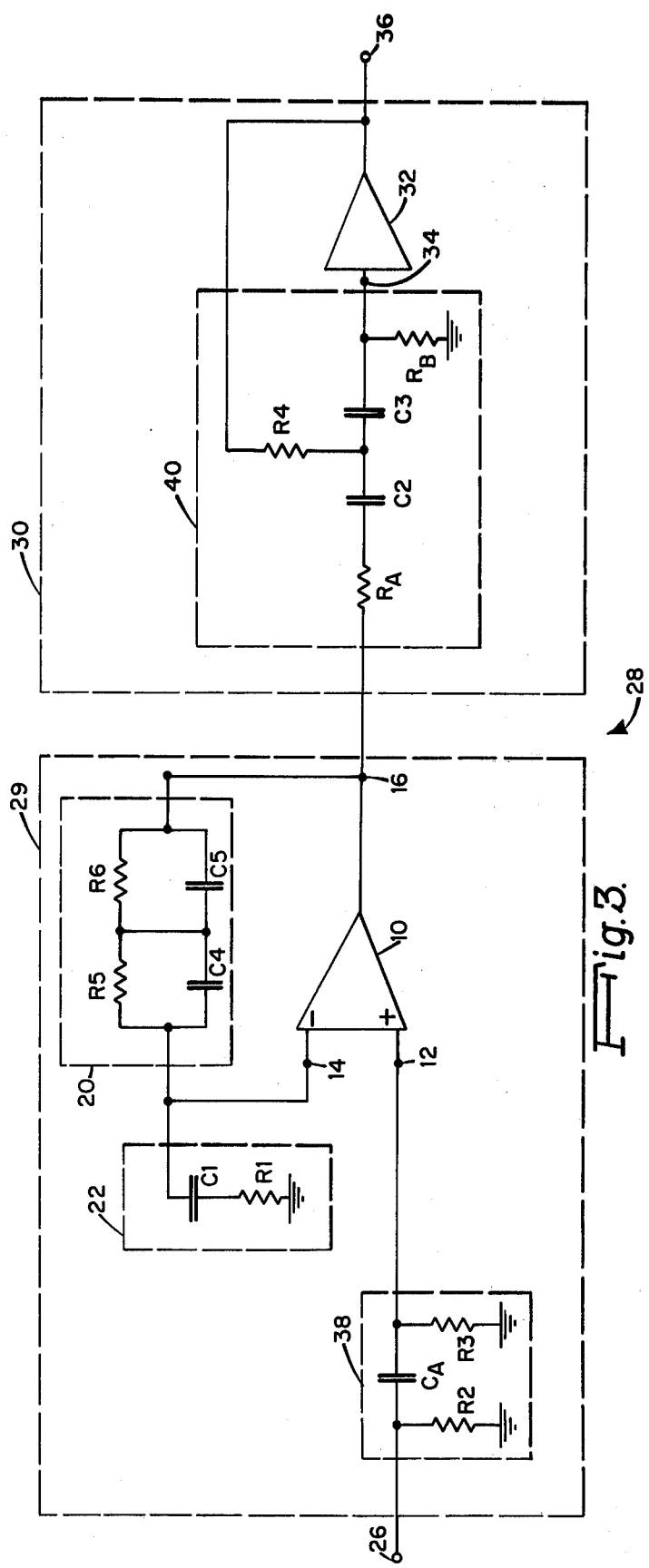
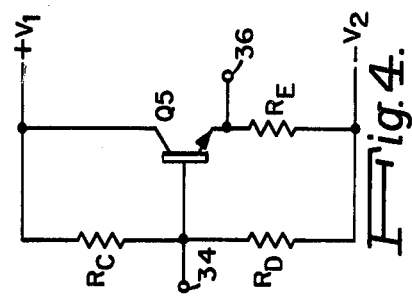
Fig. 3.
Fig. 4.

PHONOGRAPH PREAMPLIFIER NETWORK WITH INFRASONIC CUTOFF RESPONSE

REFERENCE TO RELATED APPLICATION

This application is a continuation-in-part of my U.S. patent application Ser. No. 736,404, now U.S. Pat. No. 4,032,855 entitled "Phonograph Preamplifier Network With Infrasonic Cutoff Response", filed Oct. 28, 1976, and assigned to the assignee of the present application.

BACKGROUND OF THE DISCLOSURE

The present invention relates to the field of audio reproduction systems and, more particularly, to high fidelity phonograph preamplifier networks.

The normally quoted specifications of a phonograph preamplifier network, such as frequency response, noise and distortion, are of limited utility in determining how a preamplifier will sound to a listener. This is due to a variety of factors, including (1) the inability of conventional test measurements to measure performance under transient conditions, (2) the failure of performance test results to be weighted for subjective human perception or annoyance values, and (3) the effect of out-of-the-audio-passband signals on in-band performance due to inter-modulation in the preamplifier or other portions of the system.

Typically, analytical performance measuring techniques are based on gross simplifications of the actual conditions under which a preamplifier operates. Accordingly, the resultant measurements bear a relatively low correlation with the critical listening experience.

Often, subjective listening test comparisons are the most effective techniques of evaluating preamplifier performance. Of course, in such comparisons, normal use conditions must be established for the systems under test, e.g. the cartridge must be properly loaded, both resistively and capacitively, for each preamplifier under test, and preamplifier gains of the comparison tests must be very accurately matched, often to within a fraction of a decibel. In addition, grounding and shielding in test configurations must be done with great care since the preamplifier outputs must be physically close to the inputs in order to permit switching back and forth for comparative listening. Under such conditions, double blind listening tests have proven to be quite effective in providing comparative evaluations of preamplifier networks.

Such listener tests demonstrate that an important area of preamplifier performance is the infrasonic response, i.e. in the 1–20 Hz range. At such frequencies, there are substantial detectable effects due to the driving of loudspeaker systems well below their nominal cutoff frequency, i.e. where the cone is essentially unloaded (especially with vented-box loudspeakers), and due to the cartridge-caused overload and intermodulation in tape machines and power amplifiers.

A particular source of the infrasonic response problem is the characteristic peaking of warp-caused distortion in phonograph records at frequencies on the order of 4Hz. With typical tone arms and typical cartridges used in high fidelity phonographs, the tone arm and cartridge form a resonant system with a moderately high Q and a peak at frequencies between 4 and 8Hz. As a result, there appears in many systems a relatively high degree of infrasonic noise at frequencies in this range. This problem has been recognized to some extent in the prior art with the typical approach solution being the selective damping of the tone-arm-cartridge resonant system. Systems utilizing this relatively limited effectiveness solution fall short of desired performance characteristics.

A further problem with the prior art systems is based on the high frequency interaction of the preamplifier input impedance with the source impedance provided by the cartridge. It has recently been recognized in this context that the cartridge impedance includes a generally overlooked component, i.e. the sum of frequency-dependent resistive losses due to eddy current and hysteresis losses associated with coil in the cartridge. This high frequency interaction problem was not significant in vacuum tube preamplifiers, due to their characteristic input capacitance and resistance, and consequently, there has been little if any preamplifier development directed to eliminating interaction of the cartridge source impedance with that of the preamplifier input stages and interconnecting cable. Typically, cartridge specifications state the "proper" load to insure response to the specifications, yet rarely if ever are the impedances of cables or preamplifier inputs specified completely. The so-called proper load is defined in terms of fixed resistive and capacitive values, for example, a cartridge terminating resistance is specified to be 47 Kohm at the input to a preamplifier buffer. Comparative listening tests indicate that such a termination does provide satisfactory RIAA equalization. However, in the system environment, there may be a substantial capacitive effect at the preamplifier input. With such a resistive and capacitive termination, there is a substantial interaction effect with the cartridge. The failure to effectively consider the frequency dependencies of the cartridge source impedance result in significant degradation factor in the prior art phonograph systems.

Accordingly, it is an object of the present invention to provide a high fidelity phonograph preamplifier network characterized by a substantial infrasonic cutoff response.

Another object of the present invention is to provide a high fidelity phonograph preamplifier network characterized by relatively low high frequency interaction between the preamplfier input and cartridge.

SUMMARY OF THE INVENTION

Briefly, the present invention provides a network topology characterized by a substantial infrasonic response cutoff and relatively little high-frequency interaction between the preamplifier input stage and a coupled magnetic cartridge. Further, the preamplifier network of the present invention provides a relatively high gain input stage in order to insure low noise performance.

In one form of the invention, the preamplifier network is an active filter configuration with a high gain, high input impedance differential amplifier provided with an RIAA equalization feedback filter network coupled between the amplifier output and inverting input. An RC filter network is coupled between the inverting amplifier input and ground potential to provide a single, low frequency real axis pole. In addition, an input filter feedback network is coupled between the preamplifier input terminal and the non-inverting input of the amplifier, and further boot-strapped to the amplifier inverting input. The network provides a pair of low frequency off-axis complex poles.

In a second form, the preamplifier network comprises two stages, the first stage including a high gain, high input impedance differential amplifier provided with an RIAA equalization feedback filter network coupled between the amplifier output and inverting input. An RC filter network is coupled between the inverting input and ground potential to provide a single, low frequency real axis pole. The second stage is coupled to the amplifier output and includes an active filter characterized by a pair of low frequency off-axis poles.

In both forms, the single rear axis pole and two complex off-axis pole networks are adapted to control the infrasonic frequency response of the active filter preamplifier network so that the preamplifier network is characterized by an 18 dB per octave roll-off response at frequencies below a predetermined infrasonic frequency, and a relatively flat response at frequencies in a range adjoining and above that infrasonic frequency. In addition, the RC filter, input filter and equalization networks are adapted to be relatively non-interacting with cartridge source impedances at the high end of the audio spectrum, i.e. on the order of 20,000 Hz.

BRIEF DESCRIPTION OF THE DRAWINGS

The foregoing and other objects of this invention, the various features thereof, as well as the invention itself, may be more fully understood from the following description, when read together with the accompanying drawings in which:

FIG. 3 shows, in schematic form, a second exemplary preamplifier network in accordance with the present invention; and FIG. 4 shows, in schematic form, an amplifier for use in the second stage of the network of FIG. 3.

DESCRIPTION OF THE PREFERRED EMBODIMENT

Figure 1:
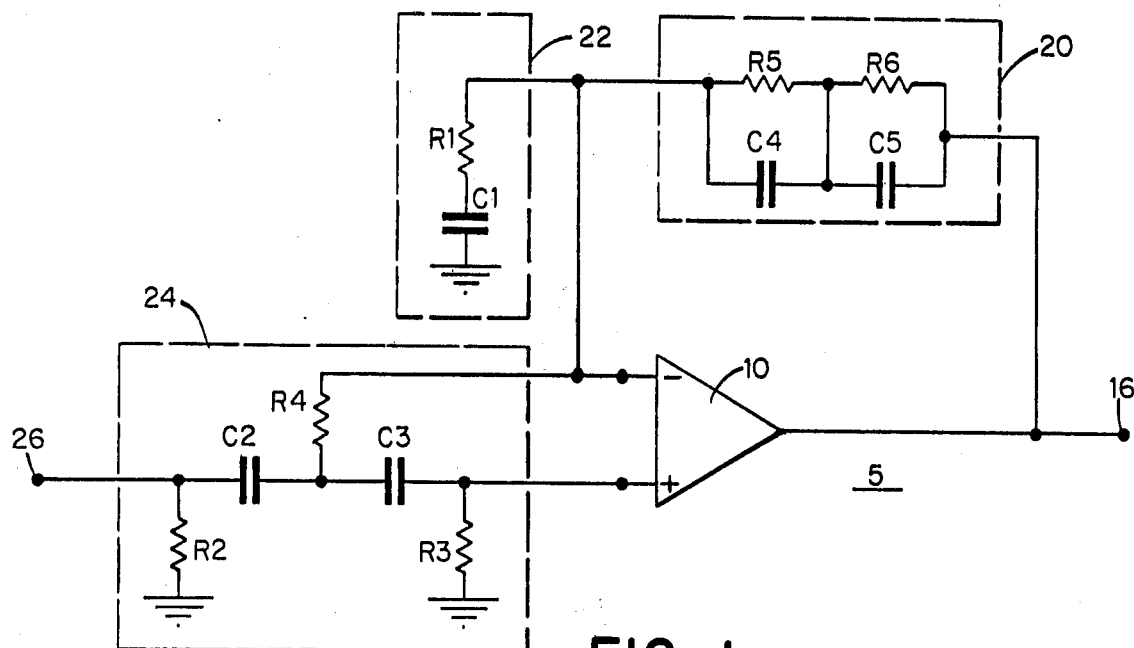
FIG. 1 shows, in schematic form, a first preamplifier network in accordance with the present invention.

FIG. 1 shows an audio signal preamplifier network 5 in accordance with the present invention. That network includes a high gain differential amplifier 10 having a non-inverting input terminal 12, an inverting input terminal 14 and an output terminal 16. The terminal 16 serves in this embodiment as the output terminal for the preamplifier network 5. An equalization feedback network 20 is coupled between the amplifier output terminal 16 and the inverting input terminal 14. As shown, the equalization network 20 is a conventional RIAA network including resistors R5, R6 and capacitors C4 and C5.

Network 5 further includes an RC filter network 22, including a resistor R1 and capacitor C1, coupled between the inverting input terminal 14 and a reference (ground) potential. An input filter feedback network 24 is coupled between the input terminal 26 of preamplifier 5 and non-inverting input terminal 12 of amplifier 10. The network 24 includes capacitors C2 and C3 connected in series between terminals 26 and 12, resistor R3 coupled between terminal 12 and ground potential, resistor R2 coupled between terminal 26 and ground potential, and resistor R4 coupled between terminal 14 and the junction between capacitors C2 and C3.

Figure 2:
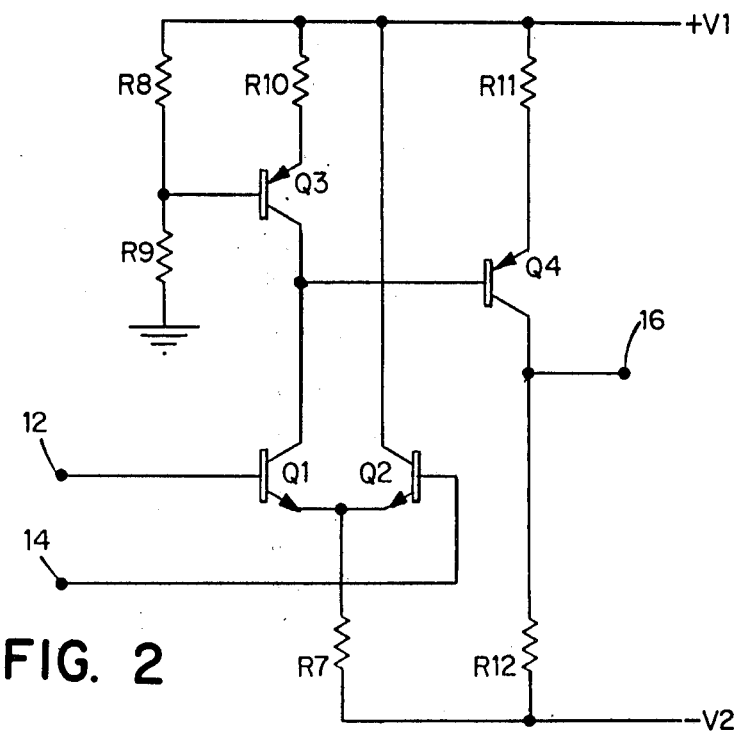
FIG. 2 shows, in schematic form, an amplifier for use in the network of FIG. 1.

FIG. 2 illustrates an exemplary circuit configuration for the amplifier 10. In that figure, transistors Q1 and Q2 form a bipolar, emitter-coupled differential amplifier, with the transistor Q1 being current source loading by transistor Q3 and the bias network provided by resistors R8, R9 and R10. Transistor Q4 provides an output signal at terminal 16.

By way of example, the component values specified in Table I may be utilized in the embodiment of FIGS. 1 and 2.

TABLE I

| R1 - 1.8K K ohms | R7 - 100K ohms | C1 - 5.6 $\mu f$ | Q1 - TIS97 |
|---|---|---|---|
| R2 - 100K ohms | R8 - 1.2K ohms | C2 - .1 $\mu f$ | Q2 - TIS97 |
| R3 - 91K ohms | R9 - 15K ohms | C3 - .1 $\mu f$ | Q3 - 2N5087 |
| R4 - 43K ohms | R10 - 6.8K ohms | C4 - .0027 $\mu f$ | Q4 - MPSA65 |
| R5 - 1.2M ohms | R11 - 150 ohms | C5 - 750 pf | |
| R6 - 100K ohms | R12 - 1.5K ohms | | |

In alternative embodiments, the values for the various components may be selected by first establishing the gain for the preamplifier, $Z_F + Z_I/Z_I$, where $Z_F$ is the impedance of the equalization feedback network 20, and $Z_I$ is the impedance of the RC filter network 22. In this step, for a selected R1, the value for C1 is selected so that the product R1 C1 approximately equals the product $\frac{1}{2} \pi f$, where $f$ is the desired infrasonic cutoff frequency (e.g. R1C1 = 0.01 seconds to establish a real axis pole at 16Hz). Then R5, R6, C4 and C5 values may be selected to provide RIAA equalization at the desired midband gain.

The resistors R2 and R3 are selected so that R2R3/(R2 + R3) is substantially equal to the specified cartridge load impedance, e.g. 47K ohms for typical cartridges.

Then, the values for R4, C2 and C3 are selected so that R4 is much greater than R1, and the input filter network 24 provides a pair of off-axis poles slightly above the desired infrasonic cutoff frequency (e.g. where R1C1 = 0.01 seconds, and C2 = C3, then the product R4C2 = 4.3 milliseconds to establish a pair of off-axis poles at approximately 20Hz).

With the network topology of the present invention, the preamplifier network 5 provides an input stage characterized by relatively low noise and high gain. In addition, this input stage provides relatively good isolation between the feedback loop and preamplifier input, contributing to the non-interaction of the preamplifier network and the cartridge source impedance. With the differential configuration, the feedback loop provides a high frequency loading characteristic such that the preamplifier is characterized by high slewing performance.

In the illustrated embodiment, the current source loading on the input stage produces relatively high stage gain, yielding large open loop-gain. This large open-loop gain provides a relatively large closed-loop RIAA feedback, maintaining the input impedance relatively high and the distortion low. The preamplifier network 5 has no measurable cartridge inductance interaction, and distortion at 7 volts output at 1kHZ is less than 0.04% and consists of second and third harmonics (therefore being inaudible). The distortion decreases monotonically at lower levels.

The input filter network 24 is bootstrapped from the feedback input of the preamplifier to provide a complex pole pair which cooperatively interacts with the real axis pole produced by C1 and R1 of RC filter network 22 to yield an 18 dB per octave pass characteristic.

The performance characteristics of preamplifier network 5, as illustrated in FIGS. 1 and 2 with the component values from Table I, is shown in Table II.

TABLE II

A. Frequency response

| | | |
|---|---|---|
| 1. | Voltage source, audio passband | ±0.5 dB, 25 Hz − 20 kHz |
| 2. | Infrasonic response | −1 dB, 20 Hz |
| | | −3 dB, 15 ½ Hz |
| | | −12 dB, 10 Hz |
| | | −21 dB, 7 Hz |
| | | −35 dB, 4 Hz |
| 3. | Cartridge impedance interaction (high-inductance cartridge, 20 Hz - 20 kHz) | less than ±0.2 dB |

B. Noise

| | | |
|---|---|---|
| 1. | Referenced to 10 mV rms, 1 kHz input, ANSI "A" weighted; cartridge source | −82 dB |
| 2. | Short-circuited input, ANSI "A" weighted | −86 dB |

C. Total harmonic distortion

| | | |
|---|---|---|
| 1. | 1 kHz, 7 V rms output | 0.04% |
| 2. | 20 kHz, 5.6 V rms output | 0.04% |
| 3. | 20 Hz, 7 V rms output | 0.06% |

Note: Harmonic distortion decreases monotonically at lower output levels. Distortion products are a mixture of second and third harmonics.

D. Intermodulation distortion

| | | |
|---|---|---|
| 1. | In using SMPTE method of 60 Hz and 7 kHz tones mixed 4:1 and preemphasized by RIAA record function | |
| | Measured at 6 V rms composite output level | 0.05% |
| | Measured at 1 V rms composite output level | 0.008% |
| 2. | Difference tone intermodulation using 13.0- and 13.1-kHz tones at a composite level of 40 mV rms | less than 0.016% |

E. Preemphasized square-wave input even-order distortion products, 1 kHz

| | | |
|---|---|---|
| 1. | Voltage at input of device 19 mV rms, 600 mV peak; worst case even harmonic level | −75 dB, 2nd harmonic |
| 2. | Average of all even harmonics in passband | −78 dB |

F. Sine-wave input overload, 1 kHz

100 mV rms

G. Slew rate

| | |
|---|---|
| Measured slew rate at output with preemphasized square-wave input | Over 7 V/μs, instrumentation limited |

FIG. 3 shows an alternative form audio signal preamplifier network 28 in accordance with the present invention. In FIG. 3, circuit elements which correspond to similar elements in the configuration of FIG. 1 are denoted with identical reference designations. Network 29 comprises two stages coupled between the input terminal 26 and output terminal 36 of preamplifier network 28. The first stage 29 comprises a high gain differential amplifier 10 having a non-inverting input terminal 12, and inverting input terminal 14 and an output terminal 16. The terminal 16 serves in this embodiment as the coupling terminal to the second stage 30 of preamplifier network 28. An equalization feedback network 20 is coupled between the amplifier output terminal 16 and the inverting input terminal 14. As shown, the equalization network 20 is a conventional RIAA network including resistors R5, R6 and capacitors C4 and C5.

Stage 29 further includes an RC filter network 22, including a resistor R1 and capacitor C1, coupled between the inverting input terminal 14 and a reference (ground) potential. An input network 38 is coupled between the input terminal 26 of preamplifier 28 and the non-inverting input terminal 12 of amplifier 10. The network 38 includes capacitor $C_A$ connected between terminals 26 and 12, resistor R2 connected between terminal 26 and ground potential, and resistor R3 connected between terminal 12 and ground potential.

In the embodiment of FIG. 3, the amplifier 10 may take the same form as that illustrated in FIG. 2, having transistors Q1 and Q2 forming a bi-polar, emitter-coupled differential amplifier, with the transistor Q1 being current source loaded by transistor Q3 and the bias network provided by resistors R8, R9 and R10.

The second stage 30 comprises an infrasonic filter network 40 and a high gain, high input impedance amplifier 32. Network 40 is coupled between terminal 16 and a non-inverting terminal 34 of amplifier 32. The output of amplifier 32 is connected to terminal 36. The infrasonic filter 40 includes an input resistor $R_A$, an input terminating resistor $R_B$, a feedback resistor R4, and a pair of series connected capacitors C2 and C3 coupled between the input and output resistors $R_A$ and $R_B$. The input resistor $R_A$ is connected to the output terminal 16 of amplifier 10 (which may be characterized substantially as a low impedance voltage source in the present embodiment). The output terminating resistor $R_B$ is coupled between terminal 34 and ground potential. The feedback resistor R4 is connected between the junction of capacitors C2 and C3 and the output terminal for amplifier 32.

FIG. 4 illustrates an exemplary circuit configuration for the amplifier 32. In that figure, a transistor Q5 is connected in an emitter-follower configuration between terminals 34 and 36, with resistors $R_C$ and $R_D$ providing an operating point bias between potentials +V1 and −V2 and emitter $R_E$ providing an emitter load resistor. In the present embodiment, the resistors $R_C$ and $R_D$ eliminate the need for resistor $R_B$ in the network 40, and so with the FIG. 4 configuration, the resistor $R_B$ is deleted.

By way of example, the component values specified in Table III may be utilized in the embodiment of FIG. 3, in conjunction with the amplifiers shown in FIGS. 2 and 4.

TABLE III

| | | | |
|---|---|---|---|
| R1 - 2.4K ohms | R9 - 15K ohms | C1 - 4.7 μf | Q1 - TIS97 |
| R2 - 100K ohms | R10 - 6.8K ohms | C2 - .1 μf | Q2 - TIS97 |
| R3 - 91K ohms | R11 - 150 ohms | C3 - .1 μf | Q3 - 2N5087 |
| R4 - 43K ohms | R12 - 1.5K ohms | C4 - .0027 μf | Q4 - MPSA65 |
| R5 - 1.2M ohms | $R_A$ - 220 ohms | C5 - 750 pf | Q5 - TIS97 |
| R6 - 100K ohms | $R_C$ - 390 Kohms | $C_A$ - 10 μf | |
| R7 - 100K ohms | $R_D$ - 430 Kohms | V1,V2 = 12 volts | |
| R8 - 1.2K ohms | $R_E$ - 4.7 Kohms | | |

In alternatives to the presently-described embodiment, the values for the various components may be selected by first establishing the mid-band gain for the preamplifier 28, $Z_F + Z_I/Z_I$, where $Z_F$ is the impedance of the equalization feedback network 20 and $Z_I$ is the impedance of the RC filter network 22. In this step, the values for R1, C1, R5, R6, C4 and C5 may be selected in the same manner described in conjunction with the FIG. 1 configuration to establish a predetermined infrasonic cutoff frequency and to provide RIAA equalization at the desired midband gain.

The component values for input filter network 38 are selected to provide a.c. coupling of the audio signal from the phonograph cartridge to the non-inverting input of amplifier 10, and further to provide a substantially matching resistive impedance to the specified cartridge load impedance, e.g. 47 Kohms for typical cartridges.

The values for R4, C2 and C3 are selected so that network 40 provides a pair of off-axis poles slightly above the desired infrasonic cutoff frequency (e.g. where the product R1·C1 equals 0.01 seconds, and C2

= C3, then the product R4·C2 = 4.3 milliseconds to establish a pair of off-axis poles at approximately 20 Hz). The input and output termination resistors $R_A$ and $R_B$ for network 40 are selected to appropriately terminate the filter network with stage 29 and amplifier network 32, respectively.

The preamplifier configurations illustrated in FIGS. 1 and 3 both provide relatively high gain and low noise performance while maintaining low distortion and low cartridge inductance interaction. Both configurations provide substantially an 18 db per octave roll-off response at frequencies below a predetermined infrasonic frequency and a relatively flat response at frequencies in a predetermined range adjoining and above that predetermined infrasonic frequency. While the input filter 24 coupled to amplifier 10 in the FIG. 1 configuration is effective at blocking infrasonic noise from the cartridge and tone arm, the amplifier 10 introduces a substantial noise component in this infrasonic range because of the boot-strapping by way of resistor R4 of the input filter 24. In contrast, the infrasonic filter 40 of network 28 is not boot-strapped to the corresponding amplifier 10. Consequently, the infrasonic noise power measurable at the input terminal 36 of preamplifier 28 is substantially lower than the corresponding noise power for preamplifier 5.

While the infrasonic noise power at the output of the preamplifier 28 is relatively low compared to that of the preamplifier 5, the amplifier portion of the first stage of preamplifier 28 must accommodate relatively high infrasonic voltage excursion compared to the comparable amplifier portion in the preamplifier 5 in order to avoid overload due to the cartridge-tone arm introduced infrasonic noise. As a result, the suitability of either the FIG. 1 or FIG. 3 configuration for a given application depends primarily on a trade-off of the measureable noise power characteristics versus the input stage infrasonic input overload requirement. Otherwise, the characteristics of preamplifier networks 28 and 5 are similar.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

I claim:

1. An audio signal preamplifier network having a preamplifier input terminal for coupling to a magnetic phonograph cartridge, and having a preamplifier output terminal, comprising a first stage including:
   a first high gain amplifier having inverting and non-inverting input terminals and an output terminal, said input terminals being characterized by relatively high impedance, and said non-inverting amplifier input terminal being coupled to said preamplifier input terminal,
   equalization feedback network coupled between said amplifier output terminal and said inverting terminal,
   an RC filter network characterized by a single real axis pole and including a first resistor, R1, and first capacitor, C1, coupled in series between said inverting input terminal and a first reference potential, and
   a second stage including:
   an infrasonic filter network characterized by a pair of off-axis complex poles, and including a second amplifier having a relatively high input impedance non-inverting input terminal and having an output terminal coupled to said preamplifier output terminal, and further including second and third capacitors, C2 and C3, respectively, coupled in series between said first amplifier output terminal and said second amplifier input terminal by way of an input resistor $R_A$, an output termination resistor $R_B$, coupled between said second amplifier input terminal and a second reference potential, and a feedback resistor, R4, coupled between said second amplifier output terminal and the junction between said second and third capacitors,
   wherein said RC filter and said infrasonic filter networks are adapted to control the infrasonic frequency response of said preamplifier network whereby said preamplifier network is characterized by an 18 dB per octave roll-off response at frequencies below a predetermined infrasonic frequency and a relatively flat response at frequencies in a predetermined range adjoining and above said predetermined infrasonic frequency.

2. A preamplifier network according to claim 1 wherein:
   said equalization feedback network comprises a first parallel connected resistor (R5) and capacitor (C4) network and a second parallel connected resistor (R6) and capacitor (C5) network coupled in series between said inverting terminal and said amplifier output terminal, and
   wherein further:
   i. the product R1C1 substantially equals $\frac{1}{2}\pi f$, where $f$ equals said predetermined infrasonic frequency,
   ii. the mid-band gain of said preamplifier network $(Z_F + Z_I)/Z_I$, substantially equals a predetermined value, where $Z_F$ equals the impedance of said equalization feedback network, and $Z_I$ equals the impedance of said RC filter network,
   iii. R4 is relatively large compared to R1, and
   iv. R4, C2 and C3 establish said off-axis poles at a frequency relatively close to and above said predetermined infrasonic frequency.

3. A preamplifier network according to claim 2 wherein said non-inverting input terminal of said first amplifier is coupled to said preamplifier input terminal by way of an a.c. coupling and cartridge impedance matching network.

4. A preamplifier network according to claim 3 wherein said a.c. coupling and cartridge impedance matching network comprises a coupling capacitor $C_c$, connected between said preamplifier input terminal and said first amplifier non-inverting input terminal and further comprises a first input resistor R2 connected between said preamplifier input terminal and said reference first potential and a second input resistor R3 connected between said first amplifier non-inverting input terminal and said first reference potential, wherein the product R2R3/(R2 + R3) substantially equals a predetermined value.

5. A preamplifier network according to claim 1 wherein said first amplifier is a differential bipolar, emitter-coupled amplifying network.

6. A preamplifier network according to claim wherein the input stage of said differential amplifying network is current source loaded.

7. A preamplifier network according to claim 6 wherein:

said equalization feedback network comprises a first parallel connected resistor (R5) and capacitor (C4) network and a second parallel connected resistor (R6) and capacitor (C5) network coupled in series between said inverting terminal and said amplifier output terminal, and wherein further:
 i. the product R1C1 substantially equals $\frac{1}{2}\pi f$, where $f$ equals said predetermined infrasonic frequency,
 ii. the mid-band gain of said preamplifier network, $(Z_F + Z_I)/Z_I$, substantially equals a predetermined value, where $Z_F$ equals the impedance of said equalization feedback network, and $Z_I$ equals the impedance of said RC filter network,
 iii. R4 is relatively large compared to R1, and
 iv. R4, C2 and C3 establish said off-axis poles at a frequency relatively close to and above said predetermined infrasonic frequency.

8. A preamplifier network according to claim 5 wherein:

said equalization feedback network comprises a first parallel connected resistor (R5) and capacitor (C4) network and a second parallel connected resistor (R6) and capacitor (C5) network coupled in series between said inverting terminal and said amplifier output terminal, and wherein further:
 i. the product R1C1 substantially equals $\frac{1}{2}\pi f$, where $f$ equals said predetermined infrasonic frequency,
 ii. the mid-band gain of said preamplifier network, $(Z_F + Z_I)/Z_I$, substantially equals a predetermined value, where $Z_F$ equals the impedance of said equalization feedback network, and $Z_I$ equals the impedance of said RC filter network,
 iii. R4 is relatively large compared to R1, and
 iv. R4, C2 and C3 establish said off-axis poles at a frequency relatively close to and above said predetermined infrasonic frequency.

9. A preamplifier network according to claim 1 wherein said non-inverting input terminal of said first amplifier is coupled to said preamplifier input terminal by way of an a.c. coupling and cartridge impedance matching network.

10. A preamplifier network according to claim 9 wherein said a.c. coupling and cartridge impedance matching network comprises a coupling capacitor $C_A$ connected between said preamplifier input terminal and said first amplifier non-inverting input terminal and further comprises a first input resistor R2 connected between said preamplifier input terminal and said reference first potential and a second input resistor R3 connected between said first amplifier non-inverting input terminal and said first reference potential, wherein the product R2R3/(R2 + R3) substantially equals a predetermined value.

* * * * *